United States Patent [19]

Niffenegger et al.

[11] 3,769,459

[45] Oct. 30, 1973

[54] VOLUME AND TONE CONTROL FOR MULTI-CHANNEL AUDIO SYSTEMS

[75] Inventors: Paul J. Niffenegger, Des Plaines; Ronald J. Freimark, Addison, both of Ill.

[73] Assignee: Motorola, Inc., Franklin Park, Ill.

[22] Filed: July 20, 1970

[21] Appl. No.: 56,313

[52] U.S. Cl. .............. 179/1 VL, 179/1 D, 333/28 T

[51] Int. Cl. .............................................. H03j 5/04

[58] Field of Search ......................... 179/1 D, 1 VL; 325/319; 330/30 D; 333/28 T

[56] References Cited

UNITED STATES PATENTS

| | | | |
|---|---|---|---|
| 3,135,830 | 6/1964 | Starai | 179/1 G |
| 3,247,464 | 4/1966 | Morrison | 179/1 VL |
| 3,071,648 | 1/1963 | Scott | 179/1 G |
| 3,222,599 | 12/1965 | Gewertz | 330/30 D |
| 3,512,096 | 5/1970 | Nagata | 330/30 D |
| 2,488,410 | 11/1949 | Keizer | 333/28 T |
| 3,210,683 | 10/1965 | Pay | 330/30 D |
| 3,284,713 | 11/1966 | Bailey | 330/30 D |
| 1,931,664 | 10/1933 | Lavoie | 333/28 T |

*Primary Examiner*—Kathleen H. Claffy
*Assistant Examiner*—Jon Bradford Leaheey
*Attorney*—Mueller and Aichele

[57] ABSTRACT

A single volume control for a plurality of audio channels is formed by a pair of gain controllable differential amplifiers operated as small-signal amplifiers in an open-ended configuration. The current source to each differential amplifier forms the signal path between the input and output of the volume control circuit. The transistor forming the current path, and signal path, is a class A amplifier. By altering the DC bias on one of the current control devices in each of the differential amplifiers, the amount of signal coupled to the output thereof is correspondingly varied. A single potentiometer provides a DC voltage control for the variable impedance to the selected transistor of each of the differential amplifiers which, in turn, functions as a volume control for all channels.

4 Claims, 2 Drawing Figures

Inventors
PAUL J. NIFFENEGGER
RONALD J. FREIMARK
BY Mueller & Aichele
ATTYS.

VOLUME AND TONE CONTROL FOR MULTI-CHANNEL AUDIO SYSTEMS

BACKGROUND OF THE INVENTION

This invention relates generally to volume control circuits and more particularly, to a volume control circuit for multi-channel audio signal translating systems.

Heretofore, volume control circuits for audio systems, such as stereo systems, would require the use of two or more discrete variable resistance devices, such as potentiometers, connected to a common shaft for control by a common control knob. This arrangement provides means for simultaneously varying the volume of both channels of a stereo system. However, with advanced electronic technology, the electronic circuitry of such audio systems is made smaller, while the conventional ganged-together variable resistance elements remain a constant drawback as to decreased size of the circuits. Two variable resistance elements are needed in the circuit configuration used for conventional stereo operation to maintain signal isolation between the respective channels. That is, it was not possible to control the signal translation of two channels with a single variable resistance element because the single resistance would then act as a mixing network for the signals and the stereo channel separation would no longer exist.

SUMMARY OF THE INVENTION

Accordingly, it is an object of this invention to provide an improved volume control circuit for multi-channels of audio signal translation whereby the volume for each of the channels is controlled by means of a single variable resistance element.

Another object of this invention is to provide an improved volume control circuit for a multi-channel audio system which has improved signal translating characteristics through the volume control circuit.

Yet another object of this invention is to provide an improved volume control which has a low distortion level at maximum volume output of the circuit.

A feature of this invention is the use of a pair of gain controlled differential amplifiers which are connected as small-signal amplifiers in a open-ended configuration with a transistor connected in series therewith to act both as a current source and as a signal path of the signal to be controlled. The amount of signal delivered to the differential amplifiers is constant and the output is controlled by shunting that portion of the signal which is not desired by use of one of the transistors in the differential amplifier.

Briefly, the volume control circuit of this invention incorporates a pair of interconnected transistors to form a differential amplifier in each channel of the audio signal translating system. The differential amplifiers are operated as small-signal amplifiers in a open-ended configuration and a current source for each differential amplifier is provided by a current sink transistor which also acts as a signal translating path from the input of the circuit to the interconnected transistors. The sink transistors are biased as class A amplifiers and provide substantially constant gain from the input of the circuit to the interconnected transistors. By altering the bias on one of the transistors, the amount of signal shunted to a supply source or to a reference potential is varied and the remaining transistor will deliver the remaining portion of the signal to the output terminal.

That is, by biasing one of the interconnected transistors of each of the differential amplifiers so as to cause maximum shunting of the signal through that transistor, a minimum amount of signal will be delivered to the output terminal via the other transistor. Similarly, by biasing the transistor so that little or no signal is shunted to a reference potential, maximum signal will be delivered through the remaining transistor to the output terminal. The control of bias potential applied to one of the transistors in each differential amplifier is obtained by a single variable resistance element connected to a voltage source and to the base electrode of the control transistor in each of the differential amplifiers. The volume of sound obtained in each channel is then controlled in response to a single potentiometer which controls the amplitude of the audio signal by merely changing the amount of the signal which is shunted by one transistor of the respective differential amplifiers and, as such, little or no signal distortion is developed. The output of each differential amplifier is taken from the non-inverting collector of the output transistor thereof and coupled to a suitable audio driver stage for amplification and then reproduction in a speaker system. A single balance resistor is connected between the respective outputs of the volume controls to balance the signal levels in each of the channels.

Tone control of the audio signal may also be obtained by a single variable resistance element connected in circuit with a transistor which, in turn, is connected in series with a capacitor and this combination of elements is at the input of each volume control circuit. By varying the single potentiometer, tone control for each channel is achieved. By providing a transistor with the emitter electrode thereof connected to ground potential and the collector electrode thereof connected through a capacitor to the input of each of the signal channels, an inexpensive circuit is provided, and one that will function on multiple channels by a single potentiometer. The variable bias on the tone transistors effect the AC resistance of the transistors to provide a variable input at each channel. At saturation conditions of the tone transistors, full treble signal filtering is accomplished and at cut-off condition of these transistors, no change in the circuit is effected and maximum treble signals are translated through each channel. The bass boost effect is accomplished by cross-coupling the tone and volume controls so that moving the tone control to the "bass boost" position will effectuate an increase in total volume of all channels. This actually increases the gain across the audio band, but as the higher treble frequencies are shunted to ground, the result to the listener is that a bass boost condition has been provided.

The following detailed description is to be taken in conjunction with the accompanying drawings wherein like reference numerals throughout the various views of the drawings are intended to designate similar elements or components.

DESCRIPTION OF THE PREFERRED EMBODIMENT

Figures 1, 2:
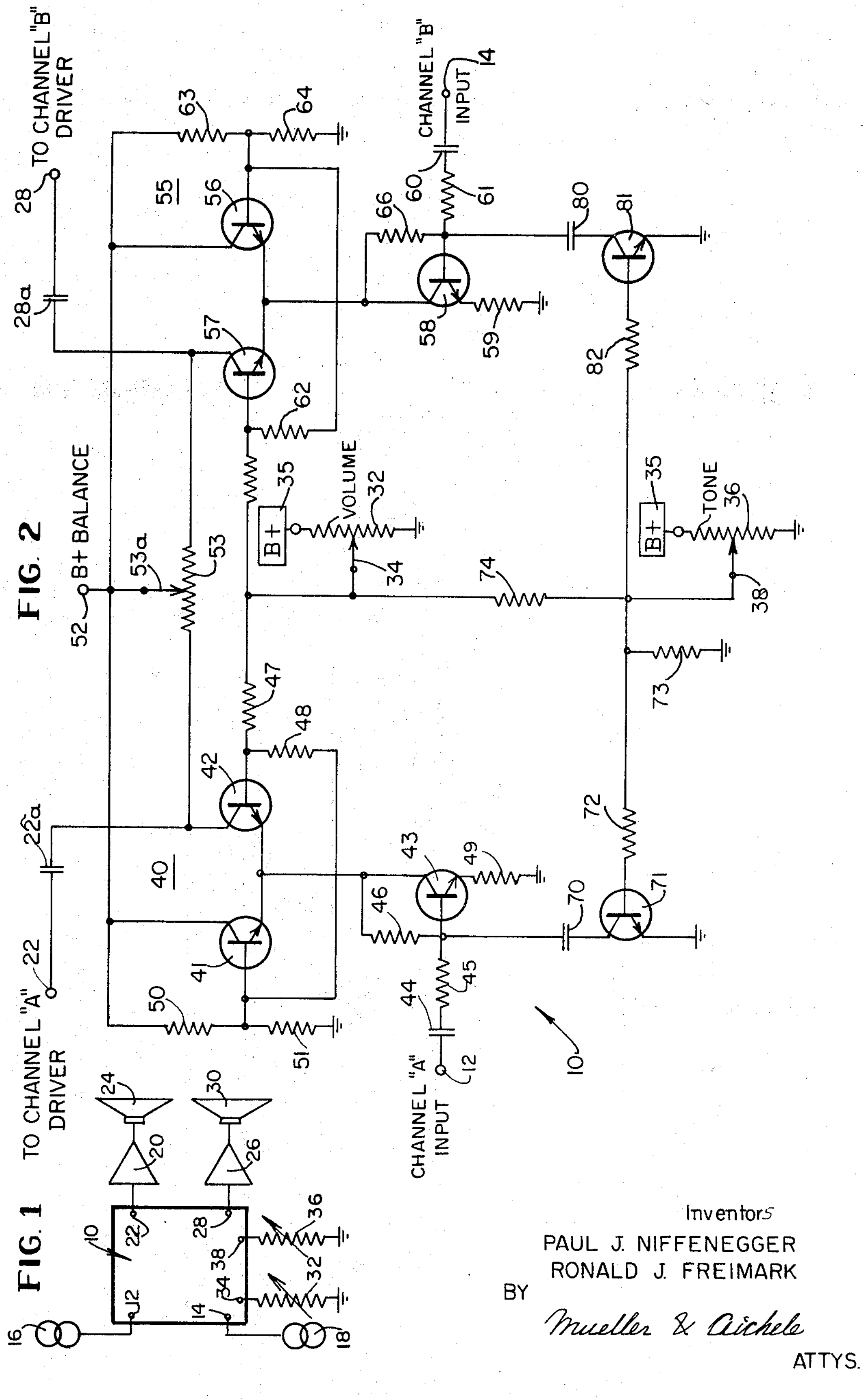
FIG. 1 is a simplified block diagram of a common volume control arrangement for a two channel stereophonic audio reproducing system.
FIG. 2 is a detailed schematic diagram showing the common volume control circuit constructed in accordance with this invention.

Referring now to FIG. 1, there is seen a common volume control circuit designated generally by reference numeral 10, which includes a pair of input terminals 12 and 14 connected to separate audio signal sources 16 and 18, respectively. The audio signals from the audio source 16 is translated through the volume control circuit 10 and applied to a power amplifier circuit 20 via an output terminal 22. The signal from the amplifier 20 is then reproduced in a speaker 24 in the conventional manner. Similarly, the signal from the audio source 18 is translated through the volume control circuit 10 and applied to power amplifier circuit 26 via an output terminal 28 and reproduced by a speaker 30.

A single variable resistance element 32 is connected to an input terminal 34 to provide a volume or gain control for the signals translating through both channels of the gain control circuit 10 without causing cross-talk or mixing of these signals so as to lose their discrete character in each channel. A second potentiometer 36 is connected to an input terminal 38 to provide a single variable resistance element to control the tone, i.e., to control the bass and treble characteristics, of the signals passing through the circuit.

The circuit arrangement of the preferred embodiment is best illustrated in FIG. 2 which shows a detailed schematic diagram of the volume control circuit 10 and wherein like reference numerals at the various circuit points correspond to those in FIG. 1. Here, the input signal from terminal 12 is applied to a first differential amplifier stage 40 comprising a pair of transistors 41 and 42 which have their emitter electrodes connected together and to a sink transistor 43. Most advantageously, the sink transistor 43 acts as a current source for the transistors 41 and 42, and simultaneously provides a signal path from the input terminal 12 to the emitter electrodes of transistors 41 and 42. The signal at the terminal 12 is coupled through a capacitor 44 and a resistor 45 to the base electrode of transistor 43 which, in turn, is forward biased by a resistor 46.

Transistor 43 is biased to a state of conduction which will translate a substantially constant signal to the differential amplifier stage 40, if the input signal is constant at the terminal 12, and the amount of signal coupled to the output terminal 22 will depend on the setting of the potentiometer 32 connected to the input terminal 34. As illustrated, the potentiometer 32 is connected to any suitable voltage source 35 to provide bias potential to the base of transistor 42 through a resistor 47. The base electrodes of transistors 41 and 42 are interconnected by a coupling resistor 48 and the emitter electrode of transistor 43 is connected to ground potential through a resistor 49. With transistor 43 properly biased, the signal from the input terminal 12 is translated through the transistor 43 and into the differential amplifier 40 such that only a portion of the signal may be applied to the output terminal 22 through a coupling and DC blocking capacitor 22a. Transistor 41 is forward biased by a pair of resistors 50 and 51 which are connected back to a terminal 52 having a positive voltage source connected thereto. Transistor 42, on the other hand, is biased by potential applied to the collector electrode thereof through a balancing resistor 53 having one end thereof connected to transistor 42 and the other end thereof connected to a transistor of the other differential amplifier circuit.

Similarly, audio signals from the input terminal 14 are applied to a differential amplifier stage 55 comprising a pair of transistors 56 and 57 having their emitter electrodes connected together and to a current sink transistor 58. The emitter of transistor 58 is connected to ground potential through a resistor 59 which limits the current in the circuit. This circuit arrangement operates exactly in the same manner and with the same result as the circuit arrangement of differential amplifier 40. That is, the input signal is coupled through a capacitor 60 and a resistor 61 to the base electrode of transistor 59 and translated through this transistor into the emitter electrodes of transistors 56 and 57, and in like manner, transistor 56 is forward biased by a pair of resistors 63 and 64 which are connected to the source terminal 52, which may be the same voltage source as the source 35. The sink transistor 58 is forward biased by a resistor 66 and acts as a class A amplifier to provide substantially constant current gain of the signal at terminal 14 to the emitter electrodes of transistors 56 and 57. The amount of signal coupled to the output terminal 28 through the coupling capacitor 28a is determined by the relative conductive states between transistors 56 and 57. Transistor 56 acts to shunt signal to the source terminal 52, the amount of which depends on the conductive state of transistor 57. The more conductive transistor 57 is, the greater the signal applied to output terminal 28, and vice-versa.

Potentiometer 53 acts as a balance control for the respective channels in which the differential amplifiers 40 and 55 are located and through which signals are translated during operation. By moving the wiper arm 53*a* more towards one or the other of the differential amplifiers 40 and 55, greater gain will be obtained in that channel to balance the system in any suitable manner corresponding to listeners preference and room configuration.

A tone control circuit may be incorporated in the circuit of this invention by providing high frequency shunting means at the input of each current sink and signal translating transistors 43 and 58. To this end a capacitor 70 has one end connected to the base electrode of transistor 43 and the other end thereof connected to ground potential through a transistor 71. Transistor 71 will provide a variable resistance to the input signal and shunt high frequency signals through the capacitor 70 to ground potential, depending on the resistance value of the transistor. This is accomplished by varying the resistance value of the potentiometer 36 connected to the base electrode of transistor 71 through a resistor 72. A fixed resistor 73 may also be connected between the potentiometer 36 and ground potential. Also, the circuit point 38 of the tone control circuit is interconnected with the circuit point 34 of the volume control circuit via a fixed resistance element 74 connected therebetween so as to have a circuit interconnection between the tone control and the volume control potentiometers 36 and 32, respectively. This will provide bass boost characteristics by causing a more uniform gain increase over the entire frequency spectrum when it is desired to boost the bass signal frequencies. This action will simultaneously increase the conduction of transistors 71 and 81 to shunt the treble frequencies to ground. That is, maximum bias voltage applied to the base electrodes of transistors 71 and 81 similarly connected to a capacitor 80 will cause maximum high frequency signals to be shunted to ground potential. However, this action will also increase the bias voltage applied to the circuit point 34 which, in turn, would increase the overall volume of the circuits.

The base electrodes of transistors 71 and 81 each have a series resistance element 72 and 82 to limit the bias potential applied thereto.

What has been described is a novel volume control circuit for controlling simultaneously the volume in each channel in a multi-channel audio system by the use of a single potentiometer which changes the DC potential applied to the base electrode of one transistor in each of the differential amplifiers. The current sink transistor connected in series with each of the differential amplifiers also acts as a signal translating path from the input terminal and the gain control of the differential amplifiers is inversely proportional to the amount of signal which is shunted to a reference potential by means of the other transistor of each of the differential amplifiers. A tone control is accomplished in a multichannel system by the use of a single potentiometer which is interconnected with the volume control by a fixed resistor to provide DC bias increase to simulate a bass boost characteristic.

Accordingly, variations and modifications of this invention may be effected without departing from the spirit and scope of the novel concepts disclosed and claimed herein.

We claim:

1. A gain control circuit for use in a multi-channel audio signal translating system including in combination, audio output circuit means, differential amplifier means connected in each channel and having an output terminal connected to each of said audio output circuit means and further including a control terminal, a current control device connected to each of said differential amplifier means, audio signal input circuit means connected to each of said current control devices for providing an audio signal path from said input circuit means through said current control device to said differential amplifier means, direct current supply means, a single volume control including variable voltage means connected between the control terminals of each of said differential amplifier means and said direct current supply means, said variable voltage means providing a selectable direct current bias voltage to the control terminal of each of said differential amplifier means for controlling the current conduction therethrough to vary the amplitude of the audio signal simultaneously in each channel.

2. The gain control circuit of claim 1 wherein said current control device comprises a transistor having the base electrode connected to said audio signal input circuit means and its collector-emitter electrodes connected in series between said differential amplifier means and a reference potential.

3. The gain control circuit of claim 2 including said differential amplifier means comprising a pair of transistors having their emitters connected together and one transistor having its collector connected to said direct current supply means and the other transistor having its collector connected to said audio output circuit means of the respective channel;

a cross-coupling resistance connected between the base electrodes of said transistors forming the differential amplifier in each channel;

said current control device being a transistor of the same conductivity type as the transistors forming the differential amplifier, and connected in series therewith to provide a DC current path for the transistors in the differential amplifier, said current control transistor having the base electrode thereof arranged for receiving the signal to be translated through the gain control circuit such that the signal is delivered to the transistors of the differential amplifier with said one transistor conducting a portion of the signal to said direct current supply means in accordance with its state of conduction and said other transistor conducting the remaining portion of the signal to said audio output circuit means depending upon its state of conduction; and a tone control circuit connected to the base electrode of said current control transistor, said tone control circuit including a capacitor connected in series with the load electrodes of a transistor.

4. The gain control circuit of claim 1 further including tone control means coupled to said audio signal input circuit means of each of said current control devices; said tone control means including a potentiometer connected to said direct current supply means for varying the bias applied thereto to change the tone of the audio signal, and resistance means coupling said volume and tone control means together to vary the conduction of each of said differential amplifier means connected to said volume control means responsively to variations in said tone control means.

* * * * *